(12) United States Patent
Lopata et al.

(10) Patent No.: US 6,424,284 B1
(45) Date of Patent: Jul. 23, 2002

(54) BASEBAND RECEIVER INCLUDING DUAL PORT DAC

(75) Inventors: Douglas D. Lopata, Boyertown; Malcolm Harold Smith, Macungie, both of PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/653,570

(22) Filed: Aug. 31, 2000

(51) Int. Cl.[7] .................................................. H03M 1/38
(52) U.S. Cl. ...................................................... 341/163
(58) Field of Search .................................. 341/161, 162, 341/163

(56) References Cited

U.S. PATENT DOCUMENTS

| | | | |
|---|---|---|---|
| 4,940,981 A | * | 7/1990 | Naylor ........................ 341/161 |
| 5,864,310 A | | 1/1999 | Kharramabadi |
| 5,955,980 A | | 9/1999 | Hanna |
| 5,963,856 A | | 10/1999 | Kim |
| 6,008,749 A | | 12/1999 | Smith |
| 6,037,889 A | | 3/2000 | Knee |
| 6,049,300 A | | 4/2000 | Shoval |
| 6,052,074 A | * | 4/2000 | Iida ............................ 341/144 |
| 6,061,010 A | | 5/2000 | Adams et al. |

FOREIGN PATENT DOCUMENTS

JP       04-252520 A   *   9/1992   ............ H03M/1/78

* cited by examiner

*Primary Examiner*—Howard L. Williams
(74) *Attorney, Agent, or Firm*—Wendy W. Koba

(57) ABSTRACT

A baseband receiver particularly well-suited for wireless applications utilizes a dual-port DAC in a successive-approximation ADC, where the dual-port DAC replaces the separate pair of single port conventional DACs and is therefore shared by the I and Q down-converted components. The use of a dual-port DAC results in significant size and power savings over conventional arrangements.

14 Claims, 2 Drawing Sheets

BASEBAND RECEIVER INCLUDING DUAL PORT DAC

TECHNICAL FIELD

The present invention relates to a receiver arrangement responsive to an incoming analog signal and forming a digital representation thereof and, more particularly, to a baseband receiver including a dual-port digital-to-analog (DAC) converter for simultaneous use in both the I- and Q-rails of the receiver.

BACKGROUND OF THE INVENTION

In a variety of communication systems the receiver portion is configured to process incoming analog signals into a digital representation for further processing in DSPs and the like. Wireless receivers, commonly used in today's cellular communication market, are exemplary of this type of analog-to-digital (ADC) receiver. In a wireless receiver, the antenna picks up a transmitted radio frequency (RF) analog signal which is down-converted (either directly or first through an IF stage) to baseband for further signal processing. Typically, the final down-conversion includes the separation of the in-phase (I) and quadrature (Q) components, where the I and Q components are then processed (i.e., digitized) along separate signal paths. A problem with such an arrangement is that a duplicate number of components are required for signal processing—one set for the I component and a separate set for the Q components—resulting in a relatively large sized receiver that consumes a significant amount of power. Both of these characteristics are undesirable for a wireless receiver, which is required to be portable (e.g., hand-held) and operate on a battery power supply. U.S. Pat. No. 5,864,310 issued to H. Khorramabadi on Jan. 26, 1999 is exemplary of one such receiver arrangement (for a wireless receiver in particular), which utilizes a pair of flash analog-to-digital converters (ADCs)—one for the I rail component and one for the Q rail. The duplication of hardware results in the ADC portion of the receiver requiring a relatively large of amount of space.

One attempt to address the power consumption problem is to use a successive approximation ADC in each signal path. Successive approximation ADCs comprise a comparator, a digital-to-analog converter (DAC), and a successive approximation register. Such a circuit is able to operate with a single-ended or differential current or voltage source, thus significantly reducing power requirements over prior arrangements. While the successive approximation ADC does alleviate some of the power consumptions problems of the prior art, the size of the receiver remains quite large.

An exemplary solution to the size problem is to utilize a single set of components to perform the analog-to-digital conversion and include a switch to alternate between digitizing the I component and the Q component. That is, "share" the hardware by switching between the two rails. While this arrangement does provide for a savings on the space required for the conversion circuitry, an excessive amount of power is required to maintain the switching speed at a rate sufficient to provide accurate output data.

Thus, a need remains in the art for a baseband receiver using ADC processing that provides sufficient conversion throughput without incurring either the size or power penalties associated with the prior art.

SUMMARY OF THE INVENTION

The need remaining in the prior art is addressed by the present invention, which relates to a receiver arrangement responsive to an incoming analog signal and forming a digital representation thereof and, more particularly, to a baseband receiver including a dual-port digital-to-analog (DAC) converter for simultaneous use in both the I- and Q-rails of the receiver.

In accordance with a preferred embodiment of the present invention, the baseband receiver maintains separate I and Q signal paths, a successive approximation analog-to-digital converter (ADC) technique to process the received analog components. The successive approximation ADC in the receiver of the present invention comprises separate sample-and-hold circuits, comparators and successive approximation registers (SARs) on each signal path, as in the prior art. In a departure from the prior art, a single dual-port digital-to-analog converter (DAC) is used to simultaneously process both the received I and Q signal components. More particularly, the outputs from both SARs are applied as separate inputs to the dual-port DAC, where the separate outputs from the dual-port DAC are fed back as "error signal" inputs to the respective comparators along the I and q signal paths. The dual-port DAC includes two separate sets of switches across a precision resistor ladder so that the same resistor ladder is used to simultaneously process the pair of input digital signals and generate as an output a pair of analog signals.

Advantageously, the dual-port DAC provides a significant size saving over using a separate pair of DACs (one for each signal path), since a dual-port DAC is approximately the same size as a conventional DAC. Further, since the dual-port DAC includes a single resistor ladder and reference potential source, it consumes approximately the same amount of power as a conventional DAC. A savings of approximately 50% in both size and power is thus achieved by using a dual-port DAC in a baseband receiver in accordance with the present invention.

Other and further advantages of the present invention will become apparent during the course of the following discussion and by reference to the accompanying drawings.

BRIEF DESCRIPTION OF THE DRAWINGS

Referring now to the drawings.

DETAILED DESCRIPTION

Figure 1:
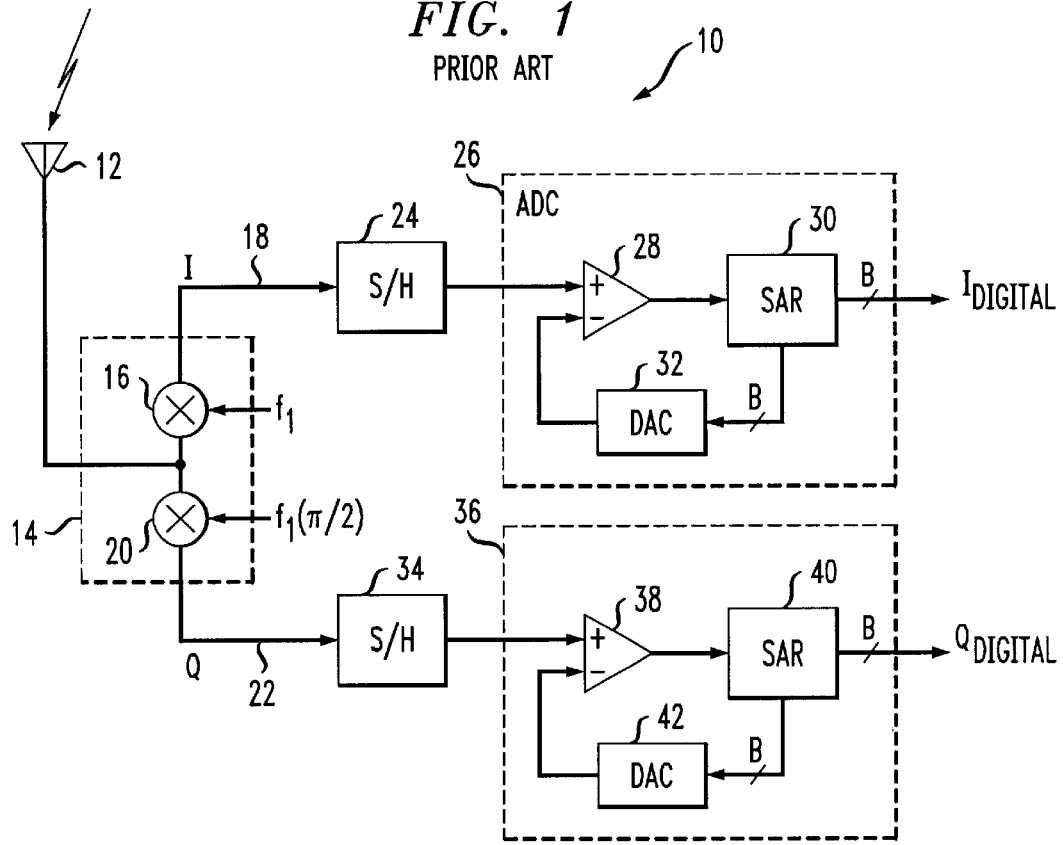
FIG. 1 illustrates an exemplary prior art baseband wireless receiver including separate I and Q rail signal paths.

Prior to discussing a baseband receiver using a dual-port DAC in accordance with the present invention, it is useful to understand the general configuration of a wireless receiver using successive approximation analog-to-digital conversion. FIG. 1 illustrates one such baseband receiver 10 that is exemplary of the prior art. As shown, an antenna 12 receives the analog input signal and applies it as an input to a down-converter 14. A first multiplier 16, using a predetermined mixing frequency $f$, receives the analog signal in down-converter 14 and produces as an output the "in-phase" ($I_{analog}$) component of the received analog signal, which then propagates along a first signal path 18. A second multiplier 20 in down-converter 14 uses a phase-shifted ($\pi/2$) version of the mixing frequency $f$ to produce the quadrature ($Q_{analog}$) component of the received analog signal, which then propagates along a second signal path 22.

The I component then passes through a sample-and-hold (S/H) circuit 24 and is ultimately digitized within an analog-to-digital converter (ADC) 26. S/H circuit 24 generates sampled segments of the analog input at a rate that can be accurately processed by the remainder of the circuitry. Various types of S/H circuits are well-known in the art and need not be discussed in detail here in order to gain a sufficient understanding of the operation of the present invention. Exemplary ADC 26 is configured as a successive approximation ADC which, as discussed above, is known in the art to consume a relatively low amount of power (a necessary requirement for wireless applications). ADC 26 comprises a comparator 28, a successive approximation register (SAR) 30, and a digital-to-analog converter (DAC) 32. Comparator 28 receives as a first input the $I_{SAM}$ component output from S/H circuit 24. The remaining input to comparator 28, as shown, is the output from DAC 32. The output from comparator 28 is applied as the input to SAR 30, which provides the digital output stream, denoted $I_{digital}$, where $I_{digital}$ is also applied as the input to DAC 32. On the first cycle of the conversion, SAR 30 produces either: (1) an output that is halfway between its previous output and zero (if the output from comparator 28 indicates that input $I_{analog}$ is less than the output from DAC 32), or (2) an output that is halfway between its previous output and the full scale value (if the output from comparator 28 indicates that input Ianalog is greater than the output from DAC 32). On successive cycles, SAR 30 continues to produce outputs halfway between two previous outputs, or between a previous output and zero, or between a previous output and the full-scale value. A successive approximation ADC thus performs a "binary search" until it arrives at a digital output ($I_{digital}$) that corresponds most closely to the input analog signal (in this case, the $I_{analog}$ component of the down-converted signal from antenna 12).

In a similar fashion, the $Q_{analog}$ component of the received signal passes through a sample-and-hold circuit 34 and is applied as an input to an ADC 36. As shown in FIG. 1, ADC 36 comprises a comparator 38, SAR 40 and DAC 42, where these components function as described above to form the output signal $Q_{digital}$. In order to achieve the desired precision in the digital output from receiver 10, DACs 32 and 42 need to be relatively large and, in fact, consume the most area in the receiver circuitry. While it is advantageous to separately process the I and Q components, there remains a competing desire to make receiver circuitry as compact and power efficient as possible.

Figure 2:
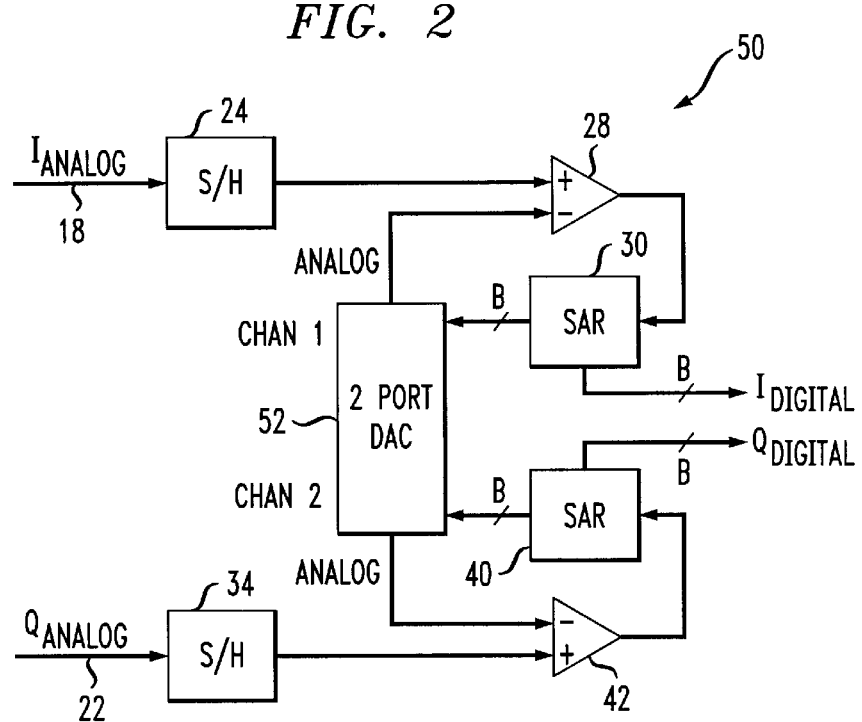
FIG. 2 illustrates an exemplary baseband wireless receiver formed in accordance with the present invention, including a dual-port DAC.

FIG. 2 illustrates an exemplary baseband receiver 50, formed in accordance with the present invention, that addresses the concerns noted above by replacing the separate DACs in each signal path with a dual-port DAC 52. As will be explained in detail below, and as is disclosed in our co-pending application Ser. No. 09/652,569 which is herein incorporated by reference, a dual-port DAC is capable of independently processing separately applied input digital signals and providing a pair of separate, independent analog output signals related thereto. Advantageously, a dual-port DAC of the present invention is comparable in size to a conventional DAC, thus essentially cutting in half the space and power required for the DAC portion of the prior art baseband receiver.

Referring to FIG. 2, various elements within receiver 50 are essentially identical to those within prior art receiver 10 and carry the same reference numeral. Indeed, receiver 50 functions in a manner similar to that described above, using a combination of a comparator, successive approximation register (SAR) and DAC to iteratively find the "best" digital output representations (i.e., $I_{digital}$ and $Q_{digital}$) for the associated analog inputs (i.e., $I_{analog}$ and $Q_{analog}$). The modification of the prior art arrangement occurs by having the outputs from both SAR 30 and SAR 40 (that is, the current "approximations" of the digital outputs) applied as separate inputs to dual-port DAC 52. As will be discussed below, dual-port DAC 52 is capable of simultaneously, yet independently, processing these two digital inputs and providing associated analog output signals. In particular, the I component output from SAR 30, denoted $I_{SAR}$, is applied along a first input line 54 to dual-port DAC 52, and the Q component output from SAR 40, denoted $Q_{SAR}$, is applied along a second input line 56 to dual-port DAC 52. The I-related output, $I_{SAR,analog}$, is then applied as the second input to comparator 28, where the Q-related output, $Q_{SAR,analog}$, is applied as the second input to comparator 38. Since the quality of the successive approximation ADC function is related to the quality of the precision resistor ladder within the DAC, the use of the same precision resistor ladder in the dual-port DAC to provide both outputs may even result in greater matching between the I and Q outputs than arrangements using separate DACs along each signal path.

Figure 3:
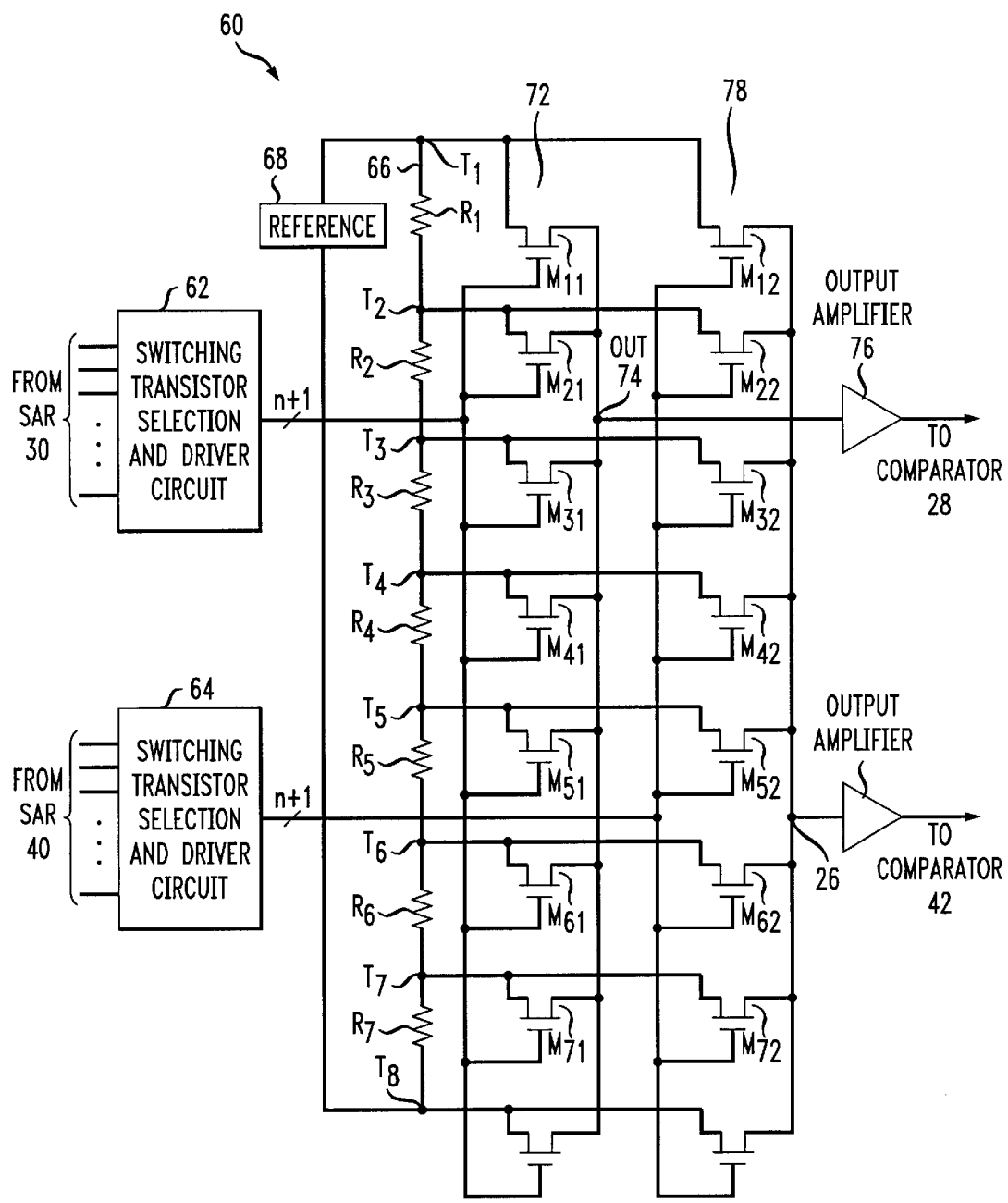
FIG. 3 illustrates in detail an exemplary dual-port DAC for use in the wireless receiver of FIG. 2.

FIG. 3 illustrates an exemplary dual-port DAC 60 that may be used as "dual-port DAC 52" in receiver 50 in accordance with the present invention. As shown, the B-bit length digital input $I_{SAR}$ from SAR 30 is applied as parallel inputs to a first switching transistor selection and driver circuit 62, and the B-bit length digital input $Q_{SAR}$ from SAR 40 is applied as parallel inputs to a second switching transistor selection and driver circuit 64. Included within dual-port DAC 60 is a resistor ladder 66, comprising a user defined number of separate resistors, denoted $R_1$–$R_N$ in FIG. 3. Resistor ladder 66 is coupled to a reference source 68, where reference source 68 provides either a standard current or voltage to operate resistor ladder 66, as is well-known in the art. It is to be understood that the resistance values of $R_1$–$R_N$ are application-dependent, and can be readily selected by one skilled in the art based on a variety of parameters such as the power to be dissipated, the potential across the resistor ladder, and the number of individual resistors in the ladder. A set of intermediate taps 70 (denoted $T_1$–$T_N$) are formed at each junction between contiguous resistors 66. In order to use the same resistor ladder to perform the digital to analog conversion on two separate inputs, separate sets of switches are utilized to control the simultaneous application of the resistor ladder to each input signal, as described in detail in our above-cited, co-pending application. As shown in FIG. 3, a first set of switches 72, comprising switches $M_{1,1}$ through $M_{N+1,1}$, is used to couple intermediate taps 70 to a first output node 74. The state of each switch within set 72 is controlled by first selection circuit 62. In the particular embodiment illustrated in FIG. 3, where the switches comprise MOS transistors, the gate terminal of each switch in set 72 is coupled to first switching transistor selection and driver circuit 62. Circuit 62 may comprise a B-to-$2^B$ decoding circuit where "B" is the number of bits in digital input signal $I_{SAR}$ from SAR 30, and $2^B$ is the number of taps 70 that may be switched to contribute to an analog output signal $I_{SAR,analog}$ at first output node 74. A first output amplifier 76, disposed beyond output node 74, is a high impedance amplifier that isolates first output node 74 so as not to load resistor ladder 66 and drives the output signal ($I_{SAR,analog}$) to comparator 28 (see FIG. 2).

A second set of switches 78, comprising switches $M_{2,1}$ through $M_{N+1,2}$, couple the same intermediate taps 70 to a second output node 80. Switches $M_{2,1}$ through $M_{N+1,2}$ have drain-to-source paths coupled between second output node 80 and a respective one of the taps $T_1$ through $T_{N+1}$. While the number of switches in second set 78 is illustrated in FIG. 3 as the same number as in first set 72, a dual-port DAC for use in the present invention is not so limited. The state of the switches in second set 78 is controlled by second switching transistor selection driver circuit 64, where circuit 64 is responsive to the $Q_{SAR}$ output from SAR 40. Like circuit 62, circuit 64 may comprise a B-to-$2^B$ decoding circuit. A high impedance output amplifier 82 is shown as disposed beyond second output node 80 to provide the necessary isolation for output signal $Q_{SAR,analog}$ that is produced at second output node 80.

In general, first selection circuit 64 selectively switches the first set of switches 72 to predetermined states, depending upon the digitally coded $I_{SAR}$ component of the signal. In a similar fashion, second selection circuit 66 selectively switches the second set of switches 78 to predetermined states, depending upon the digitally coded $Q_{SAR}$ component of the signal. Thus, the two outputs will be independent and simultaneously provide analog representations of the I and Q inputs, respectively.

Since a baseband receiver still requires the I and Q components to be processed separately, the need remains for separate sample-and-hold circuits, comparators and SAR elements, as shown in receiver 50 of FIG. 2. However, since a DAC takes up the most area in a successive approximation ADC, the overall solution of the present invention to replace a pair of DACs with a single dual-port DAC results in significant saving in overall size of the arrangement. Another advantage of the arrangement of the present invention is that the DC power drain for a dual-port DAC is essentially identical to a single port DAC, since only a single reference source (e.g., source 68) is required. Therefore, the power drain associated with the operation of the DAC in a baseband receiver is also reduced by approximately 50%.

What has been described above is merely illustrative of the applications of the principles of the present invention. Other arrangements and methods can be implements by those skilled in the art without departing from the spirit and scope of the present invention as defined by the claims appended hereto.

What is claimed is:

1. A baseband receiver for separately processing in-phase and quadrature components of a received analog signal and producing as an output in-phase and quadrature digital representations, said receiver comprising a first comparator, including first and second inputs, responsive at said first input to the received in-phase component;

a first successive approximation register responsive to the output from the first comparator and generating therefrom a digital output signal representative of the difference in signal value between the first and second comparator inputs, the digital output signal produced as the in-phase digital output of said baseband receiver;

a second comparator, including first and second inputs, responsive at said first input to the received quadrature component;

a second successive approximation register responsive to the output from the second comparator and generating therefrom a digital output signal representative of the difference in signal value between the first and second comparator inputs, the digital output signal produced as the quadrature digital output of said baseband receiver; and a dual-port digital-to-analog converter including first and second input ports and first and second output ports, the first input port coupled to the output of the first successive approximation register and the first output port coupled to the second input of the first comparator, and the second input port coupled to the output of the second successive approximation register and the second output port coupled to the second input of the second comparator.

2. The baseband receiver as defined in claim 1 wherein the dual-port digital-to-analog receiver comprises a precision resistor ladder defined as including a plurality of taps at the junctions between contiguous resistors;

a reference potential source coupled across said precision resistor ladder;

a first set of switches coupled to said plurality of taps to form the first output port of said dual-port digital-to-analog converter;

a second set of switches coupled to said plurality of taps to form the second output port of said dual-port digital-to-analog converter;

a first selection circuit, coupled between the first input port and said first set of switches, for controlling the state of each switch within said first set of switches to generate an analog output representative of the in-phase digital signal applied to said first input port; and a second selection circuit, coupled between the second input port and said second set of switches, for controlling the state of each switch within said second set of switches to generate an analog output representative of the quadrature digital signal applied to said second input port.

3. The baseband receiver as defined in claim 2 wherein the first and second set of switches comprise a first and second set of transistors.

4. The baseband receiver as defined in claim 3 wherein the transistors comprise MOS transistors.

5. The baseband receiver as defined in claim 2 wherein the reference potential source comprises a reference current source.

6. The baseband receiver as defined in claim 2 wherein the reference potential source comprises a reference voltage source.

7. The baseband receiver as defined in claim 1 wherein the receiver further comprises a first sample-and-hold circuit for receiving the in-phase analog component and generating a sampled in-phase analog component, the sampled in-phase analog component applied as the first input to the first comparator; and a second sample-and-hold circuit for receiving the quadrature analog component and generating a sampled quadrature analog component, the sampled quadrature analog component applied as the first input to the second comparator.

8. A successive approximation analog-to-digital converter for simultaneously converting a pair of input analog signals, defined as first and second analog input signals, to a pair of output digital signals, defined as first and second digital output signals, said successive approximation analog-to-digital converter comprising a first comparator, including first and second inputs, responsive at said first input to the first analog input signal;

a first successive approximation register responsive to the output from the first comparator and generating therefrom a digital output signal representative of the difference in signal value between the first and second comparator inputs, the digital output signal produced as the first digital output of said successive approximation analog-to-digital converter;

a second comparator, including first and second inputs, responsive at said first input to the second analog input signal;

a second successive approximation register responsive to the output from the second comparator and generating therefrom a digital output signal representative of the difference in signal value between the first and second comparator inputs, the digital output signal produced as the second digital output of said successive approximation analog-to-digital converter; and a dual-port digital-to-analog converter including first and second input ports and first and second output ports, the first input port coupled to the output of the first successive approximation register and the first output port coupled to the second input of the first comparator, and the second input port coupled to the output of the second successive approximation register and the second output port coupled to the second input of the second comparator.

9. The successive approximation analog-to-digital converter as defined in claim 8 wherein the dual-port digital-to-analog receiver comprises a precision resistor ladder defined as including a plurality of taps at the junctions between contiguous resistors;

a reference potential source coupled across said precision resistor ladder;

a first set of switches coupled to said plurality of taps to form the first output port of said dual-port digital-to-analog converter;

a second set of switches coupled to said plurality of taps to form the second output port of said dual-port digital-to-analog converter;

a first selection circuit, coupled between the first input port and said first set of switches, for controlling the state of each switch within said first set of switches to generate an analog output representative of the first digital signal applied to said first input port; and a second selection circuit, coupled between the second input port and said second set of switches, for controlling the state of each switch within said second set of switches to generate an analog output representative of the second digital signal applied to said second input port.

10. The successive approximation analog-to-digital converter as defined in claim 9 wherein the first and second set of switches comprise a first and second set of transistors.

11. The successive approximation analog-to-digital converter as defined in claim 10 wherein the transistors comprise MOS transistors.

12. The successive approximation analog-to-digital converter as defined in claim 9 wherein the reference potential source comprises a reference current source.

13. The successive approximation analog-to-digital converter as defined in claim 9 wherein the reference potential source comprises a reference voltage source.

14. The successive approximation analog-to-digital converter as defined in claim 8 wherein the converter further comprises a first sample-and-hold circuit for receiving the first analog input signal and generating a sampled first analog component, the sampled first analog component applied as the first input to the first comparator; and a second sample-and-hold circuit for receiving the second analog input signal and generating a sampled second analog component, the sampled second analog component applied as the first input to the second comparator.

\* \* \* \* \*